United States Patent [19]

Hiraide et al.

[11] Patent Number: 4,980,219
[45] Date of Patent: Dec. 25, 1990

[54] CARRIER TAPE FOR BONDING IC DEVICES AND METHOD OF USING THE SAME

[75] Inventors: Takashi Hiraide, Fussa; Ituro Kusunoki, Akishima; Joji Tajima, Fussa, all of Japan

[73] Assignee: Casio Computer Co., Ltd., Tokyo, Japan

[21] Appl. No.: 332,608

[22] Filed: Mar. 31, 1989

[30] Foreign Application Priority Data

| Apr. 6, 1988 | [JP] | Japan | 63-82886 |
| Apr. 6, 1988 | [JP] | Japan | 63-82887 |
| Apr. 12, 1988 | [JP] | Japan | 63-48273[U] |

[51] Int. Cl.⁵ .................. B32B 3/10; H01L 21/84; H01L 23/48; B65D 73/02
[52] U.S. Cl. .................. 428/134; 428/131; 428/156; 428/901; 428/906; 174/52.4; 361/398; 29/827; 437/206; 437/220; 357/70; 357/80; 206/330
[58] Field of Search ............... 428/134, 131, 156, 901, 428/906; 174/52.4; 361/348; 29/827; 437/206, 220; 357/70, 80; 206/330

[56] References Cited

U.S. PATENT DOCUMENTS

| 3,689,991 | 9/1972 | Aird | 29/577 |
| 3,968,563 | 7/1976 | Hamlin | 437/206 |
| 4,049,903 | 9/1977 | Kobler | 437/206 X |
| 4,551,912 | 11/1985 | Marks et al. | 437/209 X |
| 4,558,551 | 12/1985 | Goulstone et al. | 493/434 X |
| 4,763,409 | 8/1988 | Takekawa et al. | 29/827 |
| 4,801,997 | 1/1989 | Ono et al. | 174/52.4 X |

FOREIGN PATENT DOCUMENTS

| 0039865 | 4/1978 | Japan | 437/206 |
| 55-80329 | 6/1980 | Japan . |
| 58-28862 | 2/1983 | Japan . |

Primary Examiner—Ellis P. Robinson
Assistant Examiner—William P. Watkins, III
Attorney, Agent, or Firm—Frishauf, Holtz, Goodman & Woodward

[57] ABSTRACT

A carrier tape has a plurality of rows × a plurality of columns of IC device holes and two pairs of sprocket holes. A plurality of finger leads extending into each IC device hole and a conductive lead for connecting all of the finger leads are formed on the carrier tape. While the carrier tape is conveyed with feed teeth of a sprocket being meshed with one pair of sprocket holes, the finger leads and the conductive leads are formed, and solder is plating on both of the leads. Only in a bonding step, the carrier tape is conveyed with the feed teeth of the sprocket being meshed with the other pair of sprocket holes. Since the sprocket holes used in the bonding step are not deformed, highly precise positioning of IC devices required in bonding can be efficiently achieved. Positioning holes are formed in the carrier tape at intervals corresponding to a plurality of columns of IC device holes, and each processing can be performed for a carrier tape portion between the positioning holes in units of a plurality of columns. The carrier tape can be manufactured with very high efficiency.

18 Claims, 5 Drawing Sheets

CARRIER TAPE FOR BONDING IC DEVICES AND METHOD OF USING THE SAME

BACKGROUND OF THE INVENTION

1. Field of the Invention

The present invention relates to a carrier tape for bonding IC devices and a method of using the same.

2. Description of the Related Art

In recent years, a carrier tape for carrying IC devices is known. This carrier tape has sprocket holes formed at predetermined intervals along the longitudinal direction in both side edge portions.

The carrier tape is conveyed by a sprocket having feed teeth to be meshed with the sprocket holes. Each IC device is mounted in an IC device hole formed in a central portion of the carrier tape by a TAB (Tape Automated Bonding) system. A conventional carrier tape is conveyed from first to final steps with the sprocket holes being meshed with the feed teeth of the sprocket.

Bonding of an IC device onto the carrier tape requires a good number of manufacturing steps. The carrier tape is conveyed by using its sprocket holes in each step. For this reason, if the same sprocket holes are used from the first to final steps as in the case of the conventional carrier tape, the sprocket holes deform as the manufacture advances. As a result, necessary positioning precision cannot be obtained in an IC device bonding step which requires highest positioning precision.

SUMMARY OF THE INVENTION

It is, therefore, an object of the present invention to provide a carrier tape capable of maintaining positioning precision required in predetermined steps.

According to the present invention, there is provided a carrier tape for bonding an IC device, comprising an elongate flexible insulating tape having a central portion in which IC device holes are formed to constitute a matrix of a plurality of rows × a plurality of columns, and side edge portions located at both sides of the central portion, a plurality of arrays of sprocket holes being formed at predetermined intervals along a longitudinal direction of the insulating tape, and a plurality of finger leads having a conductive metal foil, each of the finger leads being formed on one surface of the insulating tape and having a portion projecting inside each of the IC device holes.

DETAILED DESCRIPTION OF THE PREFERRED EMBODIMENTS

An embodiment of the present invention will be described below with reference to the accompanying drawings.

Figure 1:
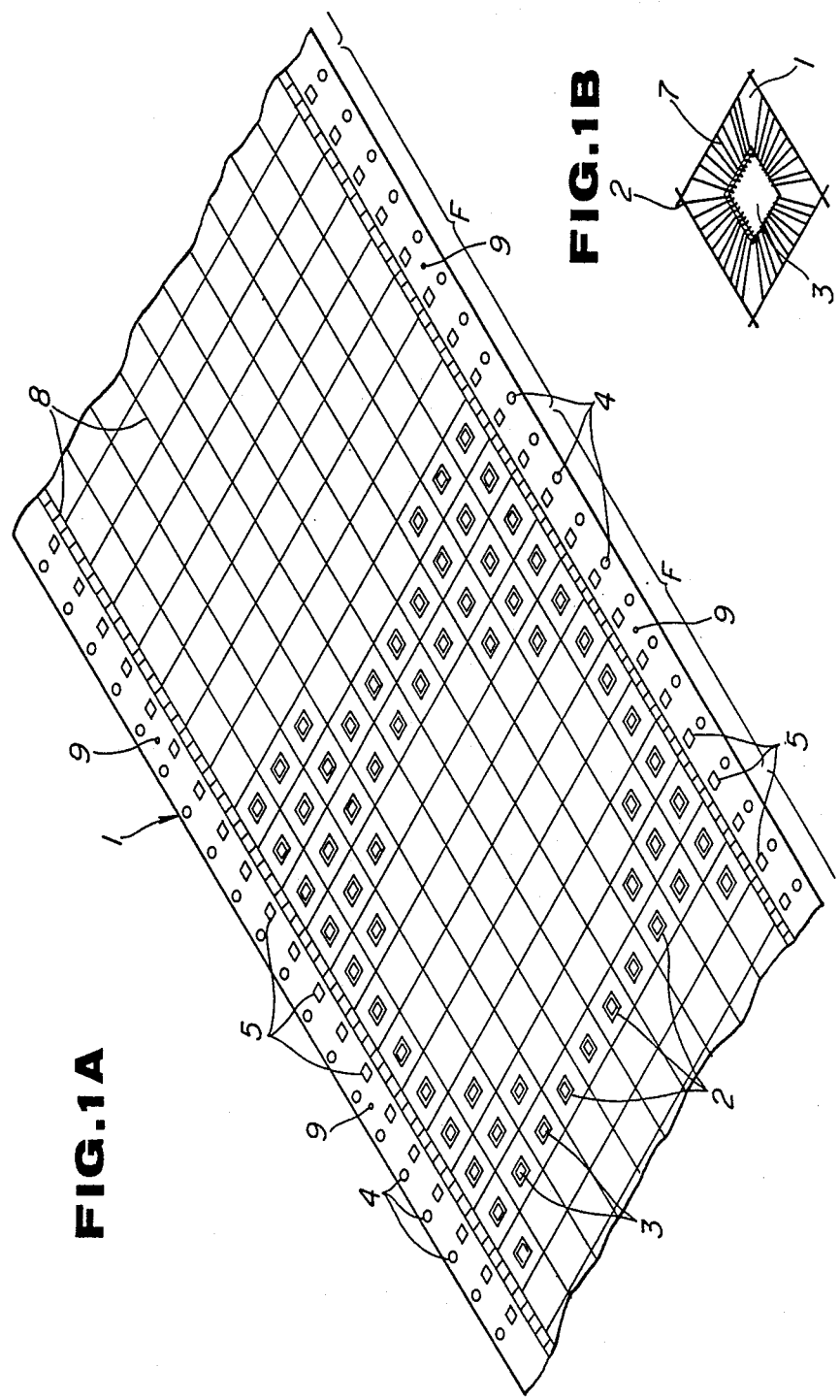
FIG. 1A is a perspective view showing an outer appearance of a carrier tape according to the present invention.
FIG. 1B is an enlarged perspective view showing a main part of FIG. 1A.

FIG. 1A is a perspective view showing an overall carrier tape according to the present invention. A carrier tape 1 is already subjected to a bonding step in FIG. 1A, and an IC device 3 is mounted in each IC device hole 2 as shown in FIG. 1B.

The carrier tape 1 consists of inexpensive polyester or polyimide having flexibility and an insulating property and has a rather large width. The carrier tape 1 has two arrays of sprockets holes 4 and 5, respectively, in each side edge portion and a large number of IC device holes 2 in its central portion. The two arrays of the sprocket holes 4 and 5, respectively, are arranged parallel to each other, and the holes 4 and 5 are formed at predetermined intervals along the longitudinal direction (of the carrier tape 1). In this case, each sprocket hole 4 arranged outside is a circular hole, and each sprocket hole 5 arranged inside is a square hole. A plurality of rows of IC device holes 2 extend in the longitudinal direction of the carrier tape 1 and are arranged at predetermined intervals across the widthwise direction of the carrier tape 1. As shown in FIG. 1B, the IC device 3 is mounted in each IC device hole 2. The IC devices 3 are arranged at a lower side of the tape 1. Electrodes (not shown) of each IC device 3 are bonded to finger leads 7 which are formed on the upper surface of the tape 1 and extended to the inside of the IC device hole 2. The finger leads 7 are formed by etching a copper foil laminated on the upper surface of the tape 1. As a result of this etching, row and column leads 8 are simultaneously formed in a matrix, and a pair of row leads 8 located at both of the sides of the carrier tape 1 are formed wider than the other leads 8. All of the finger leads 7 connected to a single IC device 3 are surrounded by and electrically connected to pairs of column and row leads 8. When tin- or solder-plating is to be performed on the finger leads 7, leads 8 are used to apply a ground potential for plating to each finger lead 7. The matrix copper foil leads 8 are continuously formed as a whole. The finger leads 7 of each IC device 3 are connected to the leads 8.

In addition to the sprockets holes 4 and 5, the fast setting holes (or marks) 9 are formed in both side edge portions of the carrier tape 1. The holes 9 are formed for every plurality of columns (F columns) of the IC devices 2. The columns extend in the widthwise direction of the carrier tape 1.

Figure 2:
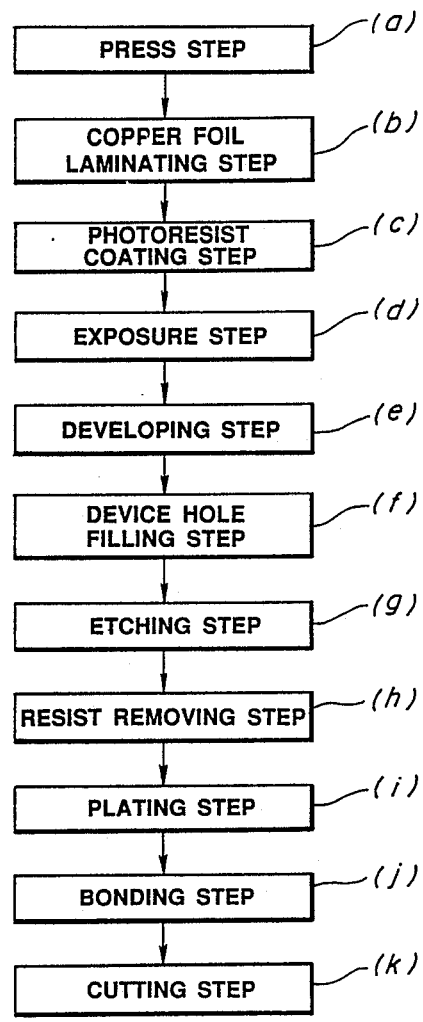
FIG. 2 is a flow chart showing manufacturing steps of the carrier tape

The carrier tape 1 having the above arrangement according the this embodiment is manufactured by steps (a) to (k) shown in FIG. 2. In a press step (a), the two arrays each of the sprocket holes 4 and 5, the IC device holes 2, and the fast setting holes 9 are formed. The IC device holes 2 are partially omitted in FIG. 1A, but an IC device hole 2 is formed in each matrix copper pattern 8. The carrier tape 1 in which predetermined holes are formed in the press step (a) is conveyed to a copper foil laminating step (b). In the laminating step, a copper foil for forming the finger leads 7 and the copper foil leads 8 on the upper surface is laminated. The tape 1 subjected to the copper foil laminating step (b) is conveyed to a photoresist coating step (c), and a photoresist is coated on the copper foil. The tape 1 subjected to the photoresist coating step (c) is conveyed to an exposure step (d). In this step, light is radiated on the photoresist to expose patterns of the finger leads 7 and the copper foil leads 8. Note that the exposure step (d) will be described in detail below. The carrier tape 1 is then conveyed to a developing step (e). In this step, developing is performed to form a predetermined image (patterns( of the finger leads 7 and the copper foil leads 8.

The tape 1 subjected to the developing step (e) is conveyed to a device hole filling step (f). In this step, an etching resist is filled in the IC device holes 2 from the lower surface side of the tape 1 to cover portions of the copper foil (laminated on the carrier tape in the copper foil laminating step (b)) corresponding to the IC device holes 2, so that portions of the finger leads 7 extending inside the holes 2 can be correctly etched. The device hole filling step (f) will be described in detail below. The carrier tape 1 subjected to the device hole filling step (f) is conveyed to an etching step (g). In this step, etching is performed to remove the copper foil except for the image (the finger leads 7 and the copper foil patterns 8) developed in the developing step (e). The tape 1 subjected to the etching step (g) is conveyed to a resist removing step (h). In this step, the etching resist filled in the device hole filling step (f) is removed. The tape 1 is conveyed to a plating step (i). In this step, tin or solder is plated to the finger leads 7. The carrier tape 1 is then conveyed to a bonding step (j). In this step, electrodes (not shown) of the IC device 3 located below each IC device hole 2 are bonded to the finger leads 7. In this manner, the IC devices 3 are mounted on the carrier tape 1. The bonding step (j) will be described in detail below. The carrier tape 1 mounting the IC devices 3 as shown in FIG. 1A is conveyed to a cutting step (k). In this step, each IC device 3 is cut from inside the copper foil leads 8, thereby manufacturing a large number of IC units.

The carrier tape 1 is conveyed from the press step (a) to the bonding step (j) by a sprocket having feed teeth to be meshed with one type of sprocket holes (in this case, the circular sprocket holes 4) formed in each side edge portion. In the bonding step (j), the tape 1 is conveyed by a sprocket having feed teeth to be meshed with the other sprocket holes (in this case, the square sprocket holes 5). The reason for switching the sprocket holes in the bonding step (j) from those used in conveyance between the copper foil laminating step (b) and the plating step (i) is as follows. That is, if the carrier tape 1 consists of a material which easily deforms, the sprocket holes deform with a high probability before the plating step (i). When the carrier tape is conveyed by using the deformed sprocket holes in the bonding step (j) requiring high positioning precision, positioning cannot be correctly performed. For this reason, unused sprocket holes without deformation are used in the bonding step (j) to obtain high precision.

In each of the copper foil laminating step (b), the developing step (e), the etching step (g), the resist removing step (h), and the plating step (i), positioning is not performed (normally, the carrier tape is sandwiched and conveyed by a pair of rollers without using either the sprocket holes 4 or 5), and processing can be performed while the carrier tape is conveyed. For this reason, a processing speed is unconditionally determined by performance of each processing apparatus. In each of the press step (a), the photoresist coating step (c), the exposure step (d), and the device hole filling step (f), however, the carrier tape must be temporarily stopped to be positioned in order to perform each step. In a conventional system, each of the above processing steps is performed by conveying the sprocket holes 4 in units of columns, resulting in a very low processing efficiency In this embodiment, therefore, each processing step is performed in units of a plurality of columns (to be referred to as a plural column unit processing hereinafter), thereby significantly increasing the efficiency.

That is, the fast setting holes (or marks) 9 are formed in both side edge portions of the carrier tape 1. The fast setting holes 9 are formed in units of a plurality of columns (F columns) of the IC device holes 2. Upon positioning, the holes 9 are detected by a sensor. That is, when a predetermined processing is completed for F columns, the sprockets is rotated at high speed by a servomotor (not shown) to convey the carrier tape 1. When the next tape feed setting holes 9 are detected by the sensor, rotation of the sprockets are stopped to position the tape 1, and the processing is repeatedly performed for next F columns. In this manner, the plural column unit processing is executed. So, in this embodiment, 10 rows×9 columns=90 IC devices are processed at the same time, and positioning need to be performed only once for each 90 IC devices.

As an example of this operation, the exposure step (d) will be described in detail below with reference to FIG. 3.

Figure 3:
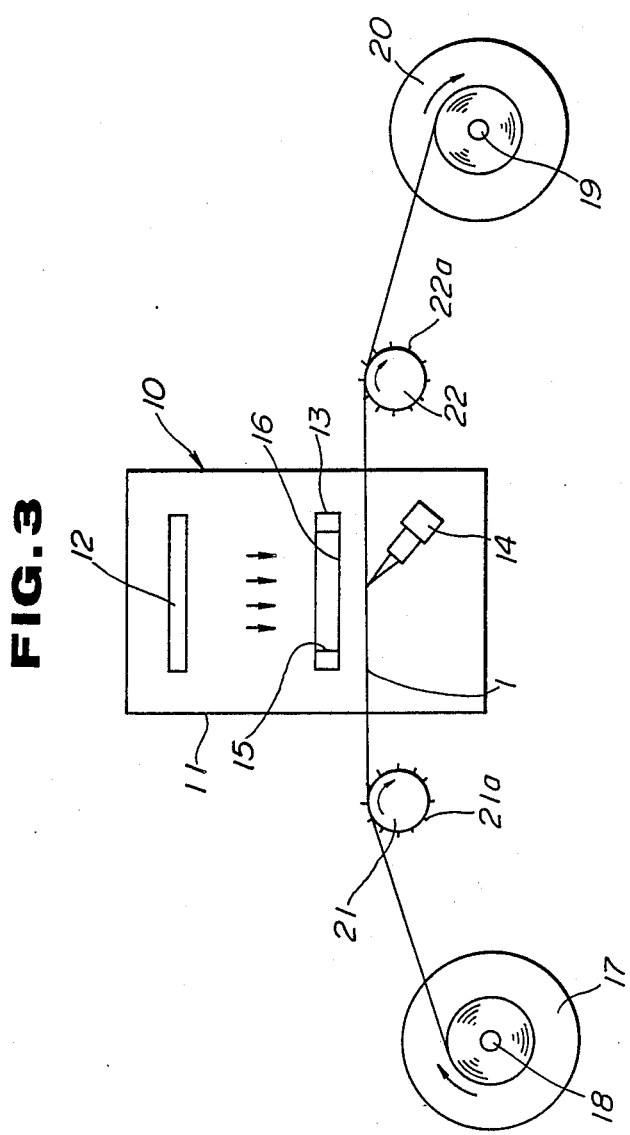
FIG. 3 is a schematic view of an exposure apparatus for explaining an exposure step.

Referring to FIG. 3, an exposure apparatus 10 comprises a light source lamp 12, an X-Y-$\theta$ table 13, and a TV camera (sensor) 14 in an apparatus main body 11. The light source lamp 12 located in an upper portion of the main body 11 and the X-Y-$\theta$ table 13 located in its central portion are arranged horizontally with respect to the main body 11. The TV camera 14 located in a lower portion of the main body 11 is obliquely arranged with respect to the main body 11 so as to detect a central portion of the X-Y-$\theta$ table 13. The X-Y-0 table 13 employs a mask 16 in an opening portion 15. The mask 16 has a size and a feature for processing 10 rows×9 columns=90 IC devices 3 at the same time as described above. The X-Y-$\theta$ table 13 can move in the X, Y, and $\theta$ directions. Position detection for the IC device holes 2 of the carrier tape 1 is performed by another TV camera (not shown). While any position deviation of the tape 1 are found, the table 13 is moved in a suitable direction to perform positioning.

The carrier tape 1 subjected to the photoresist coating step (c) in which the photoresist is coated on the copper foil is wound around a reel 17 and mounted on a tape supply shaft 18. The tape 1 passes between the X-Y-$\theta$ table 13 and the TV camera 14 in the exposure apparatus 10 and is taken up by a reel 20 mounted on a tape take-up shaft 19.

The carrier tape 1 set as described above is conveyed by sprockets 21 and 22 located at both sides of the apparatus 10. In this case, feed teeth 21a and 22a of the sprockets 21 and 22, respectively, mesh with the circular sprocket holes 4.

When the sprockets 21 and 22 rotate in an arrow direction, the carrier tape 1 is taken up by the reel 20 to move in the exposure apparatus 10. When the TV camera 14 recognizes (detects) the next of the fast setting holes 9 upon conveyance of the tape 1, the sprockets 21 and 22 are stopped, and the tape 1 is positioned in the apparatus 10. The light source lamp 12 is turned on to radiate the UV-light to the mask 16 in the X-Y-$\theta$ table 13 as indicated by arrows. The plural column unit processing is executed by this UV-light radiation. In this embodiment, the photoengraving of the finger leads 7 and the copper foil patterns 8 for 90 IC devices are executed. The plural column unit processing can be similarly performed in any of the above steps.

Processing performed in the device hole filling step (f) and an apparatus for executing this step will be described below. This step is executed by the above plural column unit processing.

Figure 4:
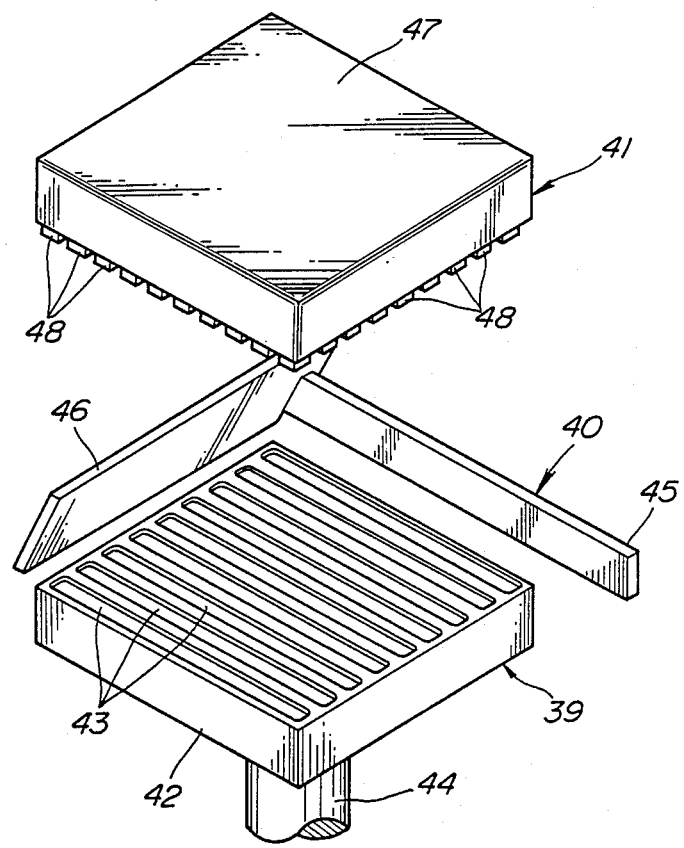
FIG. 4 is a perspective view showing an apparatus for filling a resist in an IC device hole.
Figure 5:
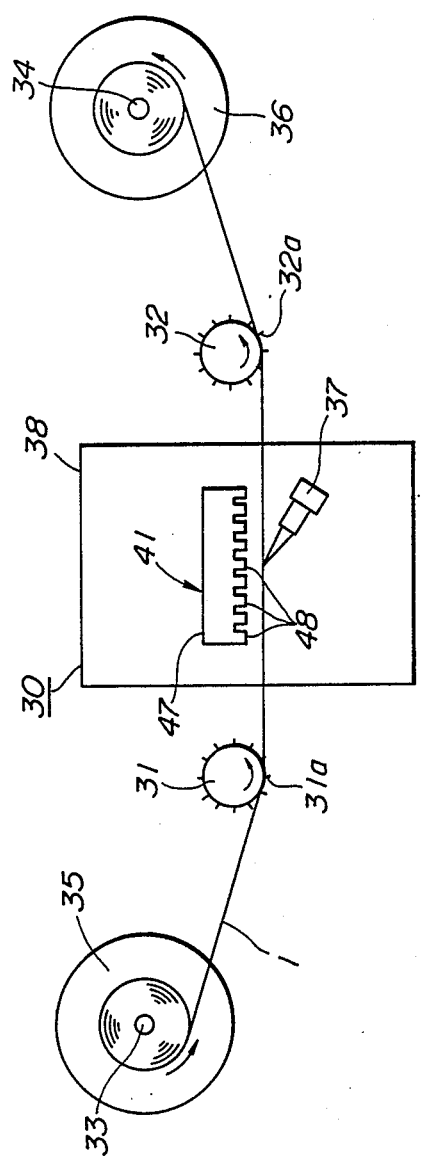
FIG. 5 is a schematic view showing the overall apparatus shown in FIG. 4.

FIG. 4 shows an arrangement of main part of an etching resist supply apparatus, and FIG. 5 shows the etching resist supply apparatus.

Sprockets 31 and 32 for conveying the carrier tape 1 are located at both sides of the apparatus 30. A tape supply shaft 33 and a tape take-up shaft 34 are located outside the sprockets 31 and 32, respectively. A reel 35, for winding the developed carrier tape 1 such that the lower surface of the tape faces up, is mounted on the tape supply shaft 33. The carrier tape 1 wound around the reel 35 is supplied in the etching resist supply apparatus 30 and taken up by a reel 36 mounted on the tape take-up shaft 34. In this case, feed teeth 31a and 32a of the sprockets 31 and 32, respectively, mesh with the circular sprocket holes 4 of the tape 1. When the sprockets 31 and 32 rotate in an arrow direction, the carrier tape 1 set as described above is taken up by the reel 36 and conveyed in the etching resist supply apparatus 30. When a TV camera 37 located obliquely in the apparatus 30 recognizes (detects) the next of the fast setting holes 9 upon conveyance of the tape 1, the sprockets 31 and 32 are stopped by an output from the camera 37, and the tape 1 is positioned in the apparatus 30. At this time, 10 rows×9 columns=90 IC device holes 2 are set as objects to be processed.

The etching resist supply apparatus 30 comprises, in its apparatus main body 38, an etching resist filling table 39, a smoothening member 40, an etching resist transfer table 41, and the TV camera 37, as shown in FIGS. 4 and 5.

The etching resist filling table 39 sequentially stores, in the apparatus main body 38, an etching resist to be supplied in the IC device holes 2 of the carrier tape 1. A rectangular base portion 42 in which the etching resist is filled is formed at a head portion of the table 39. The upper surface of the base portion 42 is horizontal, and a plurality of parallel elongated grooves 43 are formed in the overall upper surface. The number of elongated grooves 43 corresponds to the number of rows of the IC device holes 2 formed in the widthwise direction of the carrier tape 1. The width of the groove 43 is equal to the longitudinal size of each IC device hole 2. A hollow post 44 is connected to the base portion 42. An etching resist (solution) is supplied from inside the post 44 into the base portion 42 by a pump (not shown). The etching resist (solution) is injected from the post 44 into the base portion 42 and filled in the elongated grooves 43. The etching resist filling table 39 having the above arrangement is located at a position out of a passing position of the carrier tape 1 in the apparatus main body 38.

The smoothening member 40 is located above the table 39 and smoothens the surface of the etching resist filled in the base portion 42 of the table 39. Each time the etching resist is filled in the base portion 42, an inclined sliding plate 46 which is reciprocated along guide member 45 slides on the upper surface of the base portion 42, thereby smoothening the surface of the filled etching resist.

The etching resist transfer table 41 is located above the smoothening member 40 and fills the etching resist filled in the base portion 42 of the etching resist filling table 39 into the IC device holes 2 of the carrier tape 1. The transfer table 41 includes a large number of projecting transfer bases 48 arranged in a matrix manner at predetermined intervals on the lower surface of a rectangular main body 47. The number of transfer bases 48 corresponds to the number (in this embodiment, 10 rows×9 columns=90) of IC devices to be processed when the plural column unit processing is performed for the carrier tape 1. The size of each transfer base 48 corresponds to the IC device hole 2. When the carrier tape 1 is positioned in the etching resist supply apparatus 30 as described above, the etching resist transfer table 41 descends until the transfer bases 48 are brought into contact with the surface of the etching resist filled in the elongated grooves 43 in the base 42 of the etching resist filling table 39, and the etching resist in the grooves 43 is transferred to the lower surfaces of the corresponding transfer bases 48. At this time, in order not to interfere with a vertical movement of the transfer table 41, the smoothening member 40 is positioned such that its sliding plate 46 is located at the side of the base portion 42 as shown in FIG. 4. This position is a home position of the member 40. The transfer table 41 moves upward to a home position at which the transfer bases 48 on which the etching resist adheres is located slightly above the carrier tape 1. Subsequently, the transfer table 41 horizontally moves to a position above the carrier tape 1 and then descends to fill the etching resist adhered on the transfer bases 48 into the IC device holes 2. In this case, since the etching resist adhered on the transfer bases 48 is transferred into the IC device holes 2, the filled etching resist is flat and has a predetermined thickness. For this reason, a required drying time can be shortened, and a maintenance of drying step can be easily performed. In addition, since a plurality of (in this case, 90) IC device holes 2 can be simultaneously filled, filling processing of the IC device holes 2 can be performed with high efficiency.

After the predetermined filling processing is performed by the etching resist supply apparatus 30 as described above, the carrier tape 1 is conveyed again by the sprockets 31 and 32, and 90 IC device holes 2 to be processed next are positioned in the apparatus 30.

In the above embodiment, a plurality of elongated grooves 43 are formed in the upper surface of the base portion of the etching resist filling table 39. The base portion 42, however, may be a simple recess portion having an open upper surface without forming the elongated grooves 43.

Figure 6:
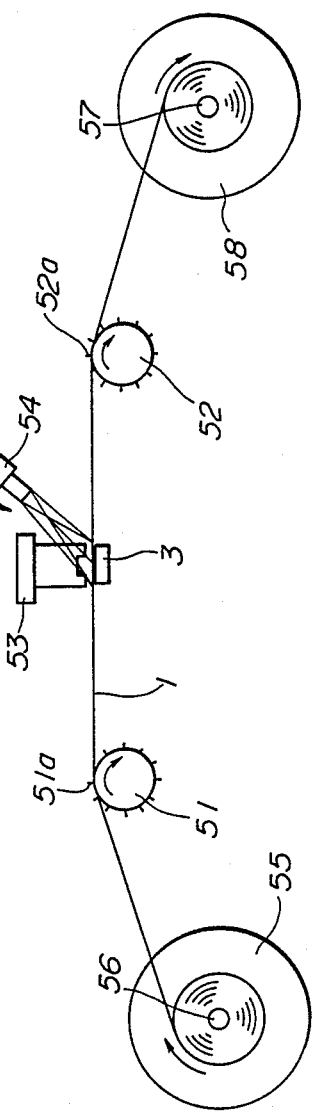
FIG. 6 is a schematic view showing a bonding apparatus.

The bonding step (j) will be described below in detail with reference to FIG. 6.

A bonding apparatus 50 used in this step comprises a heater chip 53 which can move along the widthwise direction of the carrier tape 1 and can finely move along its longitudinal direction, and a TV camera 54 for reading a wiring pattern (finger leads 7) of the tape 1 from a position above and aside the heater chip 53. When the heater chip 53 is not properly positioned to the wiring pattern, the chip 53 is finely moved in the longitudinal direction to correct the position.

The carrier tape 1 subjected to the plating step (i) in which plating is performed for the finger leads 7 is wound around a reel 55 and mounted on a tape supply shaft 56. The tape 1 passes under the heater chip 53 and is taken up by a reel 58 mounted on a tape take-up shaft 57. The tape 1 set as described above is conveyed by sprockets 51 and 52 located at both sides of the bonding apparatus 50. In this case, feed teeth 51a and 52a of the sprockets 51 and 52 mesh with the square sprocket holes 5.

When the sprockets 51 and 52 rotate in an arrow direction, the carrier tape 1 is taken up by the reel 58 and conveyed under the heater chip 53. In this bonding step, one column of IC devices is processed at once. For this reason, when the tape 1 is conveyed by a distance corresponding to one column of IC devices, the sprockets 51 and 52 are stopped. After the unbonded column is positioned under the heater chip 53 in this manner, the TV camera 54 reads this positioned state. As described above, when the heater chip 53 is not properly positioned to the finger leads 7, the chip 53 is finely moved in the longitudinal direction of the carrier tape 1 to correct the position. When the positions of the chip 53 and the finger leads 7 coincide with each other in this manner, the heater chip 53 moves in the widthwise direction to sequentially bond the IC devices 3 set under the IC device holes 2 of the column. When bonding of the column is completed, the sprockets 51 and 52 rotate again to convey the carrier tape 1, thereby positioning the next row under the heater chip 53.

When bonding is performed as described above, even if the carrier tape 1 consists of a resin film such as a polyester film which easily deforms, the tape 1 can be positioned under the heater chip 53 with high precision because it is conveyed by using the sprocket holes 5 not used in the previous steps.

What is claimed is:

1. A carrier tape for bonding an IC device, comprising:
   an elongate flexible insulating tape including:
   a longitudinally extending central portion in which IC device holes are formed, said IC device holes being arranged in the form of a matrix of a number of rows greater than two and a substantially larger number of columns, said rows extending in the longitudinal direction of said elongate insulating tape and said columns extending in the widthwise direction of said elongate insulating tape,
   side edge portions extending longitudinally of said elongate insulating tape and located at both sides of said central portion, and
   a plurality of arrays of sprocket holes formed at predetermined intervals along the longitudinal direction in each of said side edge portions of said elongate insulating tape, and including at least two of said arrays at each side edge portion of said tape, each array including a plurality of longitudinally arranged sprocket holes, the sprocket holes of each array having a constant hole pitch in the longitudinal direction of said array; and
   a plurality of finger leads each including a conductive metal foil, each of said finger leads being formed on one surface of said elongate insulating tape and having a portion projecting inside each of said IC device holes.

2. A tape according to claim 1, wherein said insulating tape further comprises a first conductive lead means formed in a matrix so as to surround each of said IC device holes and for connecting all of said finger leads, and a second conductive lead means formed on each of said side edge portions along the longitudinal direction of said insulating tape.

3. A tape according to claim 2, wherein said second conductive lead means is formed wider than said first conductive lead means.

4. A tape according to claim 2, wherein said first and second conductive leads have solder plating on surfaces thereof.

5. A tape according to claim 4, wherein said insulating tape is comprised of a polyester.

6. A tape according to claim 1, wherein said insulating tape comprises mark means for positioning, said mark means being formed every plurality of columns of said IC devices in each of said side edge portions.

7. A tape according to claim 6, wherein said mark means comprises a hole extending through said insulating tape.

8. A tape according to claim 7, wherein said insulating tape is comprised of a polyester.

9. A tape according to claim 4, wherein said insulating tape is comprised of a polyamide.

10. A tape according to claim 7, wherein said insulating tape is comprised of a polyamide.

11. A tape according to claim 1, wherein said sprocket holes of each array at each of said side edge portions of said elongate insulating tape are arranged in respective predetermined orders for engagement with a sprocket.

12. A tape according to claim 11, wherein said holes of each of said arrays at a respective side edge portion of said elongate insulating tape have different shapes.

13. A tape according to claim 12, wherein one of said arrays comprises a row of circular holes, and the other of said arrays comprises a row of rectangular holes.

14. A tape according to claim 13, wherein said circular holes are arranged closer to the peripheral edge portions of said elongate insulating tape, and said rectangular holes are located toward the interior of said elongate insulating tape, relative to said circular holes.

15. A tape according to claim 13, wherein said holes are aligned with each other along the length of said elongate insulating tape.

16. A carrier tape for bonding an IC device, comprising:
   an elongate flexible insulating tape including:
   a longitudinally extending central portion in which IC device holes are formed, said IC device holes being arranged in the form of a matrix of a number of columns and a number of rows, the number of columns being substantially larger than the number of rows, and said rows extending in the longitudinal direction of said elongate insulating tape and said columns extending in the widthwise direction of said elongate insulating tape,
   alignment means extending in spaced apart relation along said elongate insulating tape, said alignment means being fewer in number than the number of said columns of said matrix;
   side edge portions extending longitudinally of said elongate insulating tape and located at both sides of said central portion, and
   a plurality of arrays of sprocket holes formed at predetermined intervals along a longitudinal direction in each of said side edge portions of said elongate insulating tape, and including at least two of said arrays at each side edge portion of said tape, each array including a plurality of longitudinally arranged sprocket holes, the sprocket holes of each array having a constant hole pitch in the longitudinal direction of said array; and
   a plurality of finger leads each including a conductive metal foil, each of said finger leads being formed on one surface of said elongate insulating tape and having a portion projecting inside each of said IC device holes.

17. A tape according to claim 16, wherein said sprocket holes of each array at each of said side edge portions of said elongate insulating tape are arranged in respective predetermined orders for engagement with a sprocket.

18. A tape according to claim 17, wherein said holes of each of said arrays at a respective side edge portion of said elongate insulating tape have different shapes.

* * * * *